(12) United States Patent
Weyers et al.

(10) Patent No.: US 7,943,960 B2
(45) Date of Patent: May 17, 2011

(54) INTEGRATED CIRCUIT ARRANGEMENT INCLUDING A PROTECTIVE STRUCTURE

(75) Inventors: Joachim Weyers, Munich (DE); Peter Nelle, Munich (DE)

(73) Assignee: Infineon Technologies AG, Neubiberg (DE)

( * ) Notice: Subject to any disclaimer, the term of this patent is extended or adjusted under 35 U.S.C. 154(b) by 375 days.

(21) Appl. No.: 12/024,741

(22) Filed: Feb. 1, 2008

(65) Prior Publication Data

US 2009/0194843 A1 Aug. 6, 2009

(51) Int. Cl.
*H01L 29/72* (2006.01)
*H01L 23/62* (2006.01)
(52) U.S. Cl. ....................... 257/173; 257/355
(58) Field of Classification Search .................. 257/127, 257/170, 173, 355, 409, 484, E21.545, 590
See application file for complete search history.

(56) References Cited

U.S. PATENT DOCUMENTS

| | | |
|---|---|---|
| 5,386,136 A | 1/1995 | Williams et al. |
| 5,719,431 A | 2/1998 | Werner |
| 5,889,314 A | 3/1999 | Hirabayashi |
| 5,907,163 A | 5/1999 | Skebe et al. |
| 7,304,354 B2 | 12/2007 | Morris |
| 2005/0179093 A1* | 8/2005 | Morris ............... 257/371 |
| 2006/0060934 A1* | 3/2006 | Lien et al. ............ 257/499 |

FOREIGN PATENT DOCUMENTS

| | | |
|---|---|---|
| DE | 4209523 C1 | 3/1993 |
| DE | 19840031 A1 | 3/2000 |
| DE | 19953333 A1 | 5/2001 |
| DE | 10014659 A1 | 10/2001 |
| DE | 10202479 A1 | 8/2003 |
| WO | 2004090973 A1 | 10/2004 |

* cited by examiner

*Primary Examiner* — Hung Vu
(74) *Attorney, Agent, or Firm* — Dicke, Billig & Czaja, PLLC

(57) ABSTRACT

An integrated circuit arrangement. In one embodiment, the arrangement includes at least one first semiconductor zone of a first conduction type which is doped more highly than the basic doping of a first semiconductor layer and which is arranged at a distance from a first component zone adjoining the first semiconductor layer. At least one connecting zone extends as far as the at least one first semiconductor zone proceeding from the first side. A second semiconductor zone of the second conduction type, is arranged in the first semiconductor layer and is electrically conductively connected to the at least one connecting zone.

16 Claims, 5 Drawing Sheets

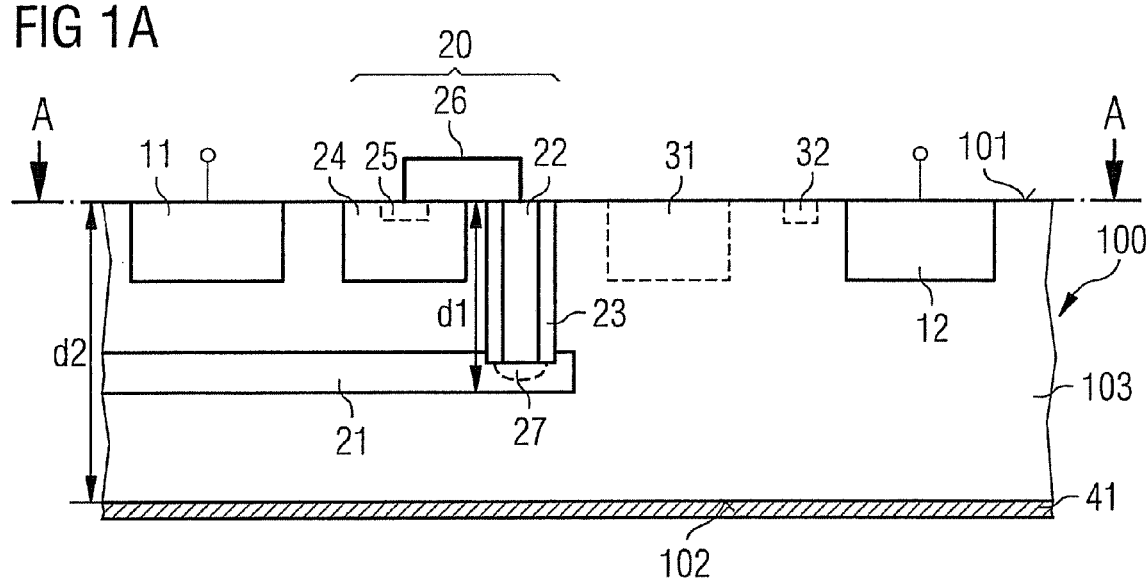
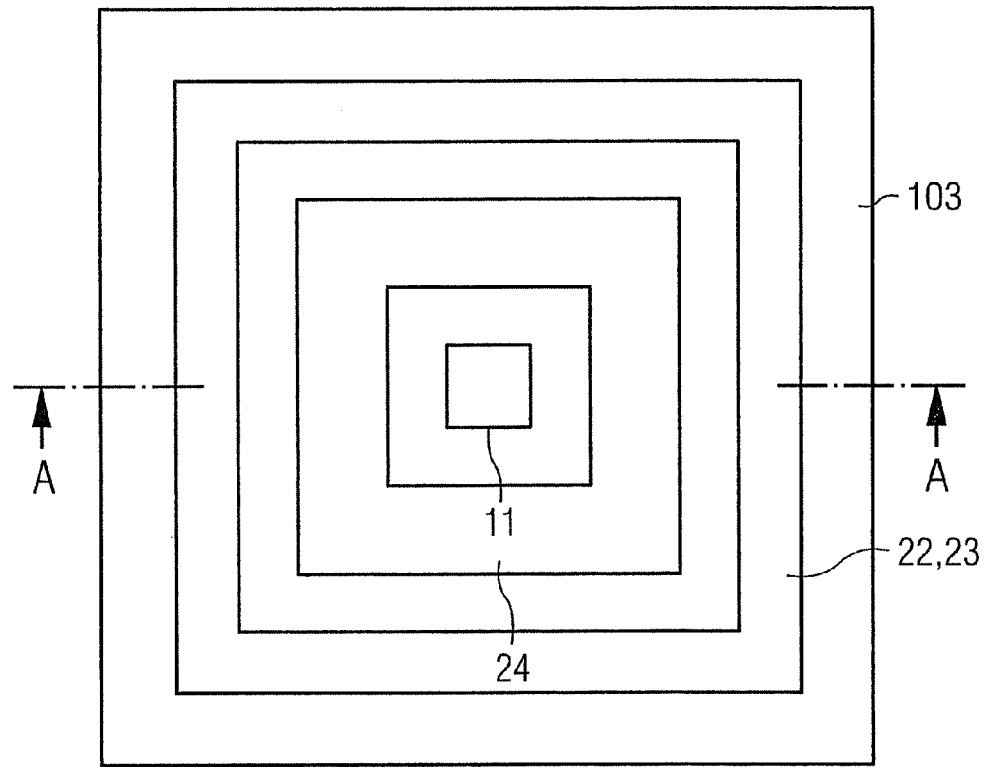

INTEGRATED CIRCUIT ARRANGEMENT INCLUDING A PROTECTIVE STRUCTURE

BACKGROUND

Integrated circuit arrangements have a plurality of semiconductor components integrated in a semiconductor body, such as transistors or diodes, for example, which are interconnected with one another. The interconnection is effected for example, by interconnects arranged above one side of the semiconductor body. In this case, within the semiconductor body, that is to say within a semiconductor layer or a semiconductor substrate in which the individual components are integrated, a current flow between the individual components is intended to be avoided. For this purpose, it is known to provide junction isolations. The junction isolations each include at least one pn junction between component zones of the individual components and a portion of the semiconductor layer or of the semiconductor substrate which has a basic doping. The pn junctions are realized in such a way that they are reverse-biased during "normal" operating states of the circuit arrangement, such that a current flow within the semiconductor substrate is prevented.

However, operating states can occur which are determined by an external circuitry or by an interconnection of the components among one another in which minority charge carriers are injected from one or from a plurality of component zones into the semiconductor substrate. In order to prevent the minority charge carriers from propagating within the substrate and adversely affecting the functionality of further components integrated in the substrate, various protective structures are known.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 1A and 1B illustrate an integrated circuit arrangement having two component zones which are arranged at a distance from one another in a lateral direction and between which a protective structure is arranged, on the basis of a vertical cross section (FIG. 1A) and a horizontal cross section (FIG. 1B).

DETAILED DESCRIPTION

Figure 2:
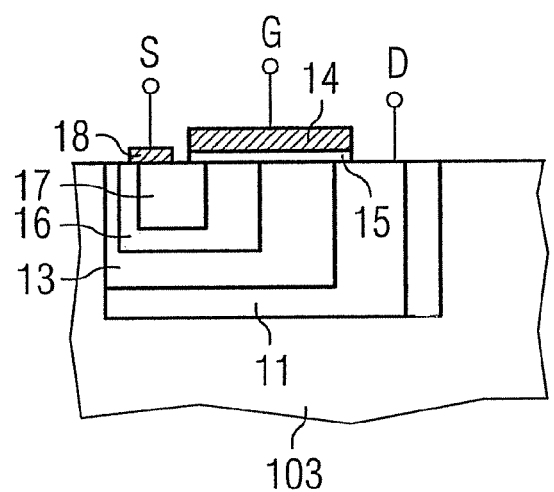
FIG. 2 illustrates an example in which one of the component zones is a drain zone of a lateral MOS transistor.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments provide an integrated circuit arrangement comprising a protective structure for reducing a minority charge carrier current in which the protective structure can be realized in space-saving fashion and effectively reduces a minority charge carrier current within the substrate.

In accordance with one embodiment, an integrated circuit arrangement includes a semiconductor body having a first side and second side and a first semiconductor layer adjacent to the first side and having a basic doping of a first conduction type, a first and a second component zone of a second conduction type, which is complementary to the first conduction type, the component zones being arranged at a distance from one another in the first semiconductor layer in a lateral direction of the semiconductor body, and including a protective structure. The protective structure includes at least one first semiconductor zone of the first conduction type which is doped more highly than the basic doping of the first semiconductor layer and which is arranged, in the lateral direction, between the first and from the second component zone, and in a vertical direction, at a distance from the first side in the first semiconductor layer or in a manner adjoining the first semiconductor layer, at least one connecting zone which extends as far as the at least one first semiconductor zone proceeding from the first side, and a second semiconductor zone of the second conduction type, which is arranged in the first semiconductor layer in the lateral direction proceeding from the connecting zone on the side of the first component zone, and which is electrically conductively connected to the at least one connecting zone.

The buried arrangement of the first semiconductor zone, that is to say the arrangement thereof at a distance from the first side of the semiconductor body, enables the protective structure to be realized in a particularly space-saving fashion.

One connecting zone suffices for making contact with the buried semiconductor zone, and the dimensions of the connecting zone can be small in a lateral direction. The connecting zones can be composed of an electrically conductive material such as, for example, a highly doped polysilicon or a metal and can be insulated by an insulation layer from that portion of the semiconductor layer which has the basic doping.

The buried first semiconductor zone very effectively prevents a propagation of minority charge carriers deep within the semiconductor body both in a lateral direction and in a vertical direction. In comparison with SOI component arrangements, in which a propagation of charge carriers from a semiconductor layer with active component zones into a substrate is prevented by an insulation layer arranged between the semiconductor layer and the substrate, the component arrangement explained can be realized more cost-effectively and additionally has a lower thermal resistance for dissipating heat loss from the semiconductor body.

FIG. 1A schematically illustrates one embodiment of a first example of a circuit arrangement on the basis of a vertical cross section through a semiconductor body 100 of the circuit arrangement. The semiconductor body has a first side 101 and a second side 102 opposite the first side 101, which are designated hereinafter as front side and rear side 101, 102. The semiconductor body 100 has additionally a semiconductor layer 103 having a basic doping of a first conduction type, which, in the example illustrated in FIG. 1, extends from the front side 101 as far as the rear side 102 and is designated hereinafter as semiconductor substrate.

The integrated circuit arrangement includes a plurality of semiconductor components which include doped semiconductor zones which extend into the semiconductor body proceeding from the front side 101. The components are, for example, MOS transistors, bipolar transistors or diodes. Doped semiconductor zones of MOS transistors are source zones, drain zones and body zones. Doped semiconductor zones of bipolar transistors are emitter zones, collector zones and base zones. Doped semiconductor zones of diodes are p-type emitter zones and n-type emitter zones or anode and cathode zones.

FIG. 1 illustrates a first component zone 11 of a first semiconductor component and a second component zone of a second semiconductor component. These first and second component zones 11, 12 are of a second conduction type, which is complementary to the basic doping of the semiconductor substrate 103, and are arranged at a distance from one another in a lateral direction of the semiconductor body 100 or the semiconductor substrate 103.

One or both of the component zones 11, 12 are for example, drain zones of a MOS transistor, in particular of a lateral MOS transistor. FIG. 2 illustrates in cross section a lateral MOS transistor having a drain zone forming the first component zone 11. At a distance from the drain zone 11 in a lateral direction, the MOS transistor has a source zone 17 of the same conduction type as the drain zone 11. The source zone 17 is surrounded by a body zone 16 doped complementarily to the source zone 17. In this component, a drift zone 13 of the same conduction type as the drain zone 11 is present between the body zone 16 and the drain zone 11; the drift zone is doped more lightly than the drain zone 11 and its dimensions and doping crucially influence the dielectric strength of the component. A gate electrode 14 is present for controlling a conducting channel in the body zone 16 between the source zone 17 and the drain zone 11, the gate electrode being insulated from the body zone 16 by a gate dielectric layer 15. The source zone 17 and the body zone 16 are short-circuited for example by a source electrode 18.

In this component, the drain zone 11 and/or the drift zone 13 directly adjoin a region of the semiconductor substrate 103 which has the basic doping of the semiconductor substrate 103. The drain zone 11 and the drift zone 13, which are doped complementarily to the semiconductor substrate 103, are n-doped in the case of an n-conducting MOS transistor. The substrate 103 is p-doped in this case.

Figure 3:
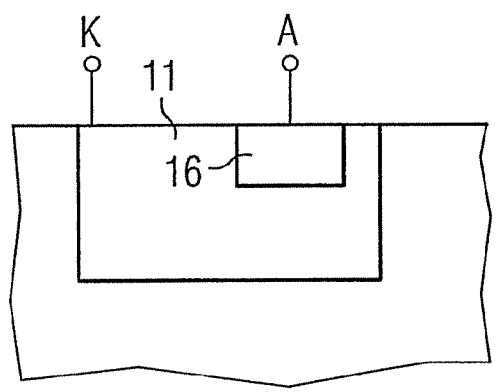
FIG. 3 illustrates an example in which one of the component zones is an active component zone of a diode.

One or both of the first and second component zones 11, 12 can also be active component zones of a diode, as illustrated in FIG. 3, for the first component zone 11. In this case, a semiconductor zone 16 doped complementarily to the component zone 11 is provided within a component zone 11. In the case of an n-doped first component zone 11, the first component zone 11 forms a cathode zone of the diode, while the further component zone 16 is p-doped and forms an anode zone. It should be pointed out in this connection that FIGS. 2 and 3 should be understood merely as an example and that the first component zone 11—and correspondingly the second component zone 12—are not restricted to forming the drain zone of a MOS transistor or one of the active component zones of a diode.

Through external circuitry connection of the semiconductor components having the first and second component zones 11, 12, it is ensured in the integrated circuit arrangement during a "normal" operating state that pn junctions between the first component zones 11, 12 and those portions of the semiconductor substrate 103 which have the basic doping are reverse-biased. In the case of a p-doped semiconductor substrate 103, this can be achieved by the component zones 11, 12 always being at an electrical potential higher than the electrical potential of the semiconductor substrate 103. In the case of an n-doped semiconductor substrate 103, this can be achieved by the component zones 11, 12 always being at an electrical potential that is lower than the electrical potential of the semiconductor substrate 103.

During the operation of an integrated circuit arrangement, however, operating states can occur in which charge carriers are injected into the semiconductor substrate 103 from the component zones 11, 12 insulated from the semiconductor substrate 103 by junction isolations or pn junctions. Within the semiconductor substrate 103, the charge carriers are then minority charge carriers, that is to say electrons in the case of a p-doped semiconductor substrate 103 and holes in the case of an n-doped semiconductor substrate 103. The injection of such minority charge carriers into the substrate 103 and the propagation of the minority charge carriers within the substrate are to be prevented since minority charge carriers which are injected for example from the first component zone 11 into the semiconductor substrate 103 and propagate there can cause malfunctions of further semiconductor components integrated in the semiconductor substrate, for example, of the semiconductor component with the second component zone 12.

It should be assumed for the following explanation that minority charge carriers can potentially be injected into the semiconductor substrate 103 from the first component zone 11, which is also designated hereinafter as injector zone. In order to prevent or at least reduce the propagation of such minority charge carriers in a lateral direction within the semiconductor substrate 103, a protective structure 20 is present, which, in the example illustrated is arranged at least partly in a lateral direction between the first and second component zones 11 or 12. The protective structure 20 has a first semiconductor zone 21, which is of the same conduction type as the basic doping of the semiconductor substrate 103 but is doped more heavily than the semiconductor substrate 103. The first semiconductor zone 21 is arranged at a distance from the front side 101 and the first component zone 11 in a vertical direction of the semiconductor substrate 103 and extends in a lateral direction of the substrate 103 as far as below the first component zone 11.

Contact can be made with the first semiconductor zone 21 of the protective structure 20 via a connecting zone 22, which extends as far as the first semiconductor zone 21 in a vertical direction of the semiconductor body 100 proceeding from the front side 101. The connecting zone 22 is composed of an electrically conductive material such as, for example, a highly doped polycrystalline semiconductor material or a metal and is arranged, in the lateral direction of the semiconductor substrate, at a distance from the first and second component zones 11, 12 and between these two component zones 11, 12. In a lateral direction, the connecting zone 22 is insulated by an insulation layer 23, for example a semiconductor oxide, from those portions of the semiconductor substrate 103 which have the basic doping. In order to achieve a low-resistance connection of this extended first semiconductor zone 21 to the connecting zone 22, a connection zone 27 doped more highly than the first semiconductor zone 21 can be provided, the connection zone being arranged between the connecting zone 22 and the first semiconductor zone 21.

The protective structure 20 additionally has a second semiconductor zone 24, which is doped complementarily to the basic doping of the semiconductor substrate 103 and which is electrically conductively connected to the first semiconductor zone 21 via the connecting zone 22. For this purpose, the second semiconductor zone 24 is electrically conductively connected to the connecting zone 22 via an electrical line connection 26, which is only illustrated schematically in FIG. 1, in the region of the front side 101. In order to achieve a low-resistance connection of the line connection 26 to the second semiconductor zone 24, a highly doped connection zone 25 of the second conduction type can be provided within the second semiconductor zone 24, the line connection 26 being connected to the connection zone. The second semiconductor zone 24 of the protective structure for example directly adjoins the front side 101 of the semiconductor body and is arranged for example between the first component zone 11 and the connecting zone 22 in a lateral direction.

The functioning of the protective structure illustrated in FIG. 1 is explained below. For this purpose, it should be assumed that minority charge carriers are injected from the first component zone 11 into the semiconductor substrate 103. In this case, the second semiconductor zone 24 doped complementarily to the basic doping of the semiconductor substrate 103 acts as a sink for some of the minority charge carriers injected into the substrate. The minority charge carriers "taken up" by the second semiconductor zone 24 influence the electrical potential of the second semiconductor zone 24. If the minority charge carriers are electrons, then the electrical potential of the second semiconductor zone 24 shifts toward negative values upon injection of minority charge carriers into the substrate 103. If the minority charge carriers are holes in the case of an n-doped semiconductor substrate, then the electrical potential of the second semiconductor zone 24 shifts toward positive potential values. Due to the electrically conductive connection between the second semiconductor zone 24 and the first semiconductor zone 21 arranged in buried fashion, the first semiconductor zone 21 assumes an electrical potential which at least approximately corresponds to the electrical potential of the second semiconductor zone 24. The electrical potential has the effect that an electric field forms within the semiconductor substrate 103 around the first semiconductor zone 21 and counteracts an injection of minority charge carriers. In this case, the electrical potential generated by the first semiconductor zone 21 in the event of an injection of minority charge carriers builds up in direct proximity to the first component zone 11 and thus effectively counteracts the injection of charge carriers. Due to different doping concentrations of the first semiconductor zone 21 and of the semiconductor layer 103, an intrinsic electric field is additionally present in the boundary region between the first semiconductor zone 21 and regions of the first semiconductor layer 103, which intrinsic electric field supports the "trapping" of the minority charge carriers by the second semiconductor zone 24.

What is more, the first semiconductor zone 21 makes it more difficult for minority charge carriers to be able to pass into the region of the semiconductor substrate 103 below the first semiconductor zone 21, thereby reducing a propagation of the minority charge carriers in a lateral direction of the semiconductor substrate 103.

The effect of the protective structure 20 can be reinforced by applying a metallization to the rear side 102. Such minority charge carriers which penetrate through the first semiconductor zone 21 can recombine in a particularly effective manner at a boundary layer between the metallization 41 and the semiconductor substrate 103. In this case, the semiconductor substrate 103 can be arranged in floating fashion, that is to say that the metallization 41 need not be at a predetermined electrical potential. What is more, there is also the possibility of connecting the semiconductor substrate 103 to a predetermined electrical potential, for example, ground via the metallization 41. In the case of a floating arrangement of the semiconductor substrate 103, there should be an ohmic junction between the metallization 41 and the semiconductor substrate 103. In the case of a metallization 41 at a predetermined electrical potential, instead of such an ohmic junction it is also possible to provide a Schottky junction between the metallization 41 and the semiconductor substrate 103.

In one embodiment, the first semiconductor zone is configured as deeply as possible in the semiconductor body 100 proceeding from the front side 101. In this case, a propagation of minority charge carriers in the region between the front side 101 and the substrate 103 lying below the first semiconductor zone 21 is prevented by the connecting zone 22 with the insulation layer surrounding the connecting zone 22. In this case, a depth d1 of the overall arrangement with the first semiconductor zone 21 and the connecting zone 22 proceeding from the front side 101 lies, for example, between 1% and 90%, in particular between 50% and 80%, of the total thickness d2 of the semiconductor substrate 103; the following therefore holds true: $d1/d2=0.01\ldots0.9$, or $d1/d2=0.5\ldots0.8$, where d1 denotes the total depth of the arrangement with the first semiconductor zone 21 and the connecting zone 22 and d2 denotes the thickness of the semiconductor substrate 103. In absolute terms, the thickness d2 of the semiconductor substrate lies, for example, between 15 µm and 750 µm and the dimension of the protective structure in the vertical direction lies, for example, between 5 µm and 200 µm. The dimensions of the first semiconductor zone 21 in a vertical direction lie, for example, between 2 µm and 60 µm, in particular between 10 µm and 15 µm.

The connecting zone 22 can be realized in such a way that it encloses the injector zone 11 in ring-shaped fashion in a lateral direction, as is illustrated schematically in FIG. 1B which illustrates a lateral cross section through the semiconductor body 100 in accordance with FIG. 1A in a sectional plane A-A. In this case, the second semiconductor zone 24 can be realized in such a way that—in a manner corresponding to the connecting zone 22—it surrounds the first component zone 11 in ring-shaped fashion. In the case of this arrangement, the injector zone 11 is completely surrounded by the protective structure 20, namely by the connecting zone 22 and the insulation layer 23 surrounding the latter in a lateral direction and by the first semiconductor zone 21 (not illustrated in FIG. 1B) in a vertical direction. In this case, the connecting zone 22 forms side walls and the first semiconductor zone 21 forms a bottom of a well-like shielding structure surrounding the first component zone 21.

In addition to the protective structure 20, referring to FIG. 1A, a guard ring 31 (represented by dashed lines) can be provided, which is doped complementarily to the semiconductor substrate 103 and which is arranged between the protective structure 20 and the second component zone 12 in a lateral direction. The guard ring can surround in ring-shaped fashion in a lateral direction the injecting first component zone 11 or the second component zone 12 to be protected and is doped complementarily to the semiconductor substrate 103. The guard ring 31 serves as a sink for those minority charge carriers which succeed in passing through the protective structure 20 in a lateral direction, and thus prevents the minority charge carriers from reaching the second component zone 12. The guard ring 31 is at a predetermined electrical potential, for example, which is chosen such that minority charge carriers are "attracted" by the guard ring. In the case of electrons as minority charge carriers, the electrical potential is a positive potential with respect to the semiconductor substrate 103 or a potential corresponding to the potential of the semiconductor substrate. In the case of holes as minority charge carriers, the electrical potential is a negative potential with respect to the semiconductor substrate 103. The guard ring 31 in particular can be a doped semiconductor zone of a logic structure integrated in the substrate 103.

As an alternative or in addition to the guard ring, the semiconductor substrate 103 in the region of the front side 101 adjacent to the component zone 12 to be protected, can be put at a predetermined electrical potential. For this purpose, a substrate connection 32 is present in the region of the front side 101, the substrate connection being of the same conduction type as the semiconductor substrate 103, but being doped more highly. The substrate connection 32 can be connected to a fixedly predetermined electrical potential, for example, ground or can be connected to the second semiconductor zone 24 or the connecting zone 26.

Figure 4A:
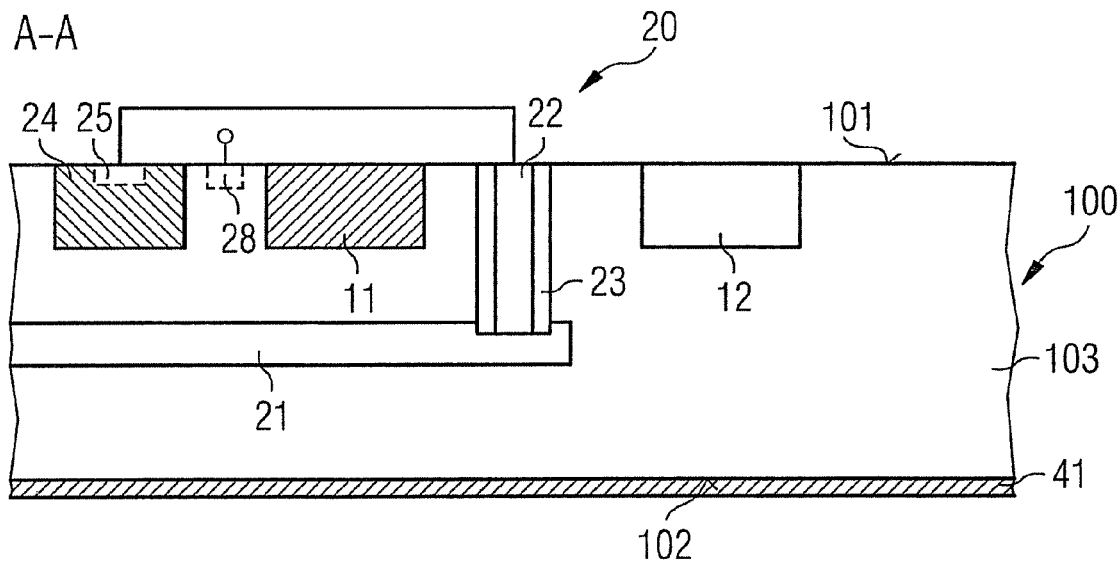
FIGS. 4A and 4B illustrate an example embodiment of an integrated circuit arrangement in which the protective structure completely surrounds a first one of the two component zones in a lateral direction, on the basis of a vertical cross section through the semiconductor body (FIG. 4A) and a lateral cross section through the semiconductor body (FIG. 4B).
Figure 4B:
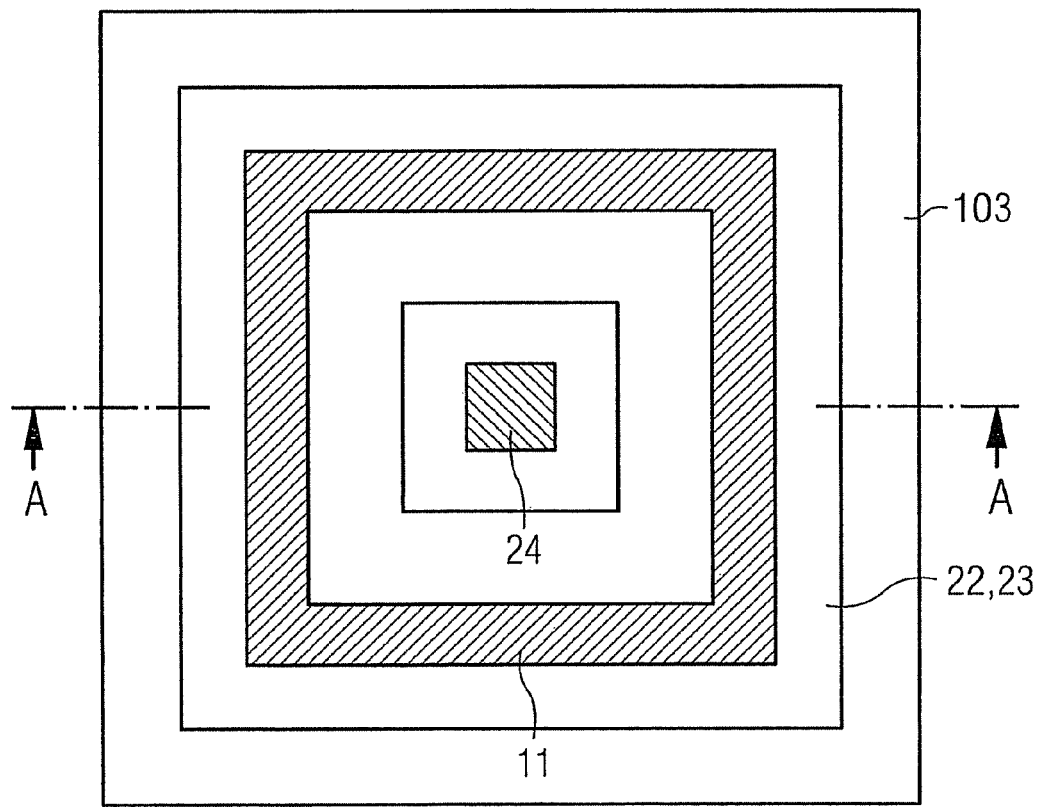

FIGS. 4A and 4B illustrate a circuit arrangement modified relative to the integrated circuit arrangement explained above, on the basis of a vertical cross section in a sectional plane A-A and on the basis of a lateral cross section through the semiconductor body 100. In this circuit arrangement, the second semiconductor zone 24 is not arranged between the first component zone 11 and the second component zone 12 in a lateral direction, rather the injector zone 11 is arranged between the second semiconductor zone 24 of the protective structure and the connecting zone 22. An explicit illustration of the insulation layer 23 surrounding the connecting zone 22 in a lateral direction has been dispensed with in FIG. 4B for reasons of clarity. In this circuit arrangement, too, the injector zone 11 is completely surrounded by the protective structure 20, namely by the connecting zone 22 and the insulation layer 23 surrounding the latter in a lateral direction and by the first semiconductor zone 21 (not illustrated in FIG. 1B) in a vertical direction.

A substrate connection 28 can be provided between the second semiconductor zone 24 of the protective structure 20 and the injector zone 11, the substrate connection being used to connect the semiconductor substrate 103 in the region between the first component zone 11 and the second semiconductor zone 24 of the protective structure 20 to a predetermined electrical potential, for example, ground. This protective structure even more effectively prevents a propagation of minority charge carriers in the semiconductor substrate 103.

Figure 5:
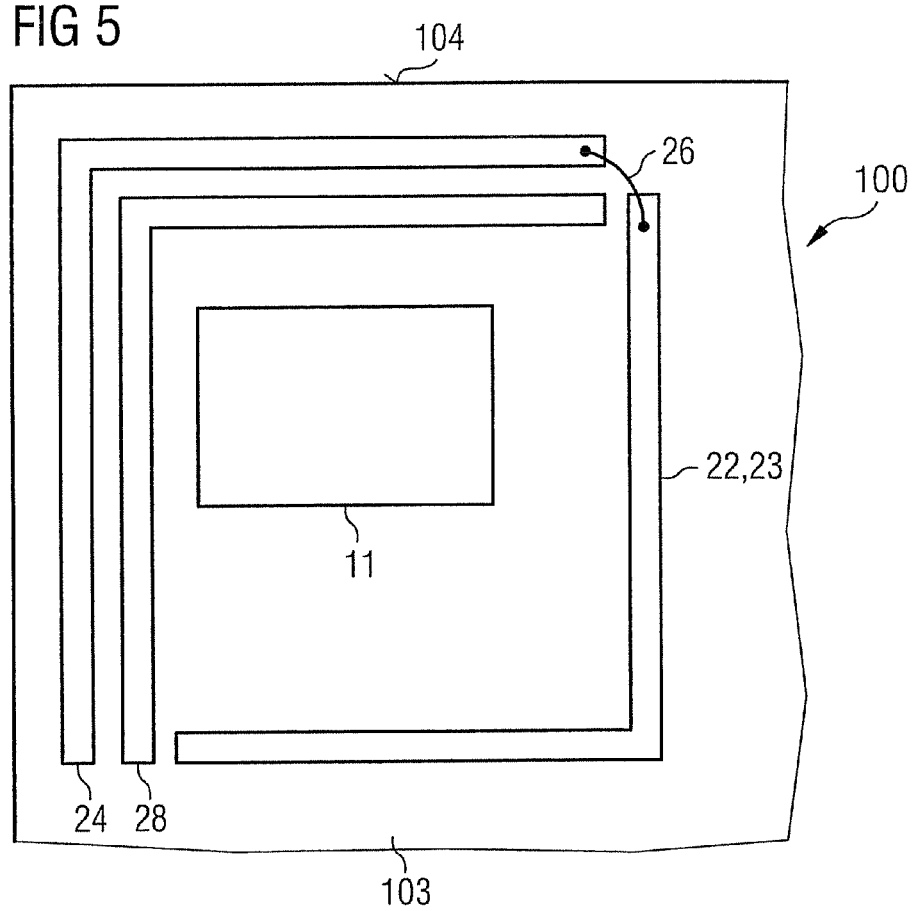
FIG. 5 illustrates an example embodiment of an integrated circuit arrangement in which a first one of the two component zones is arranged in the vicinity of an edge of a semiconductor body, on the basis of a lateral cross section of the semiconductor body.

FIG. 5 illustrates a further exemplary embodiment of an integrated circuit arrangement on the basis of a lateral cross section through the semiconductor body 100. In this example, the injector zone is arranged in the vicinity of an edge 104 of the semiconductor body or semiconductor chip 100. The connecting zone 22 is arranged at a distance from the injector zone and surrounds the injector zone 11 in a lateral direction at the sides at which the injector zone does not face the edge. The second component zone 24 is arranged between the injector zone 11 and the edge. In this case, the substrate connection 28 can be provided between the injector zone 11 and the second component zone 24.

In the example illustrated, the injector zone 11 is arranged in a corner of the semiconductor body, such that the injector zone is arranged adjacent to the edge of the semiconductor body on two sides. The connecting zone 22 is arranged adjacent to the injector zone at the two sides remaining. In a manner not illustrated in more specific detail, there is also the possibility of arranging the injector zone in such a way that it adjoins the edge only toward one side. The connecting zone 22 is then realized in such a way that it surrounds the injector zone toward the remaining three sides.

Figure 6:
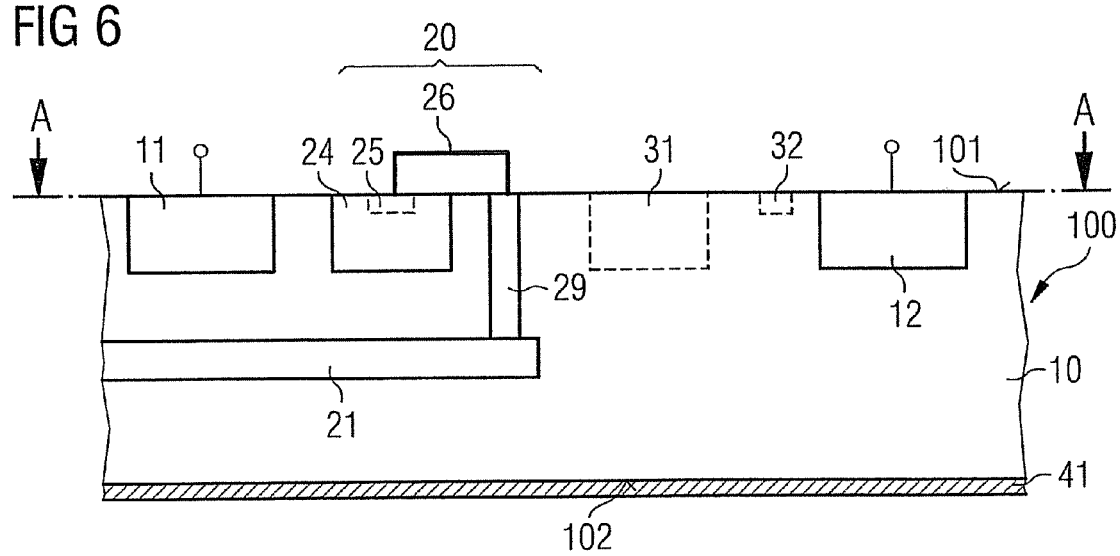
FIG. 6 illustrates an example embodiment of an integrated circuit arrangement in which a connecting zone of the protective structure is realized as a semiconductor zone.

FIG. 6 illustrates a further example of an integrated circuit arrangement. In this circuit arrangement, a connecting zone between the first semiconductor zone 21 and the front side 101 is formed by a semiconductor zone 29 of the first conduction type. In this case, the doping concentration of the connecting zone 29 may correspond to the doping concentration of the first semiconductor zone 21.

Figure 7:
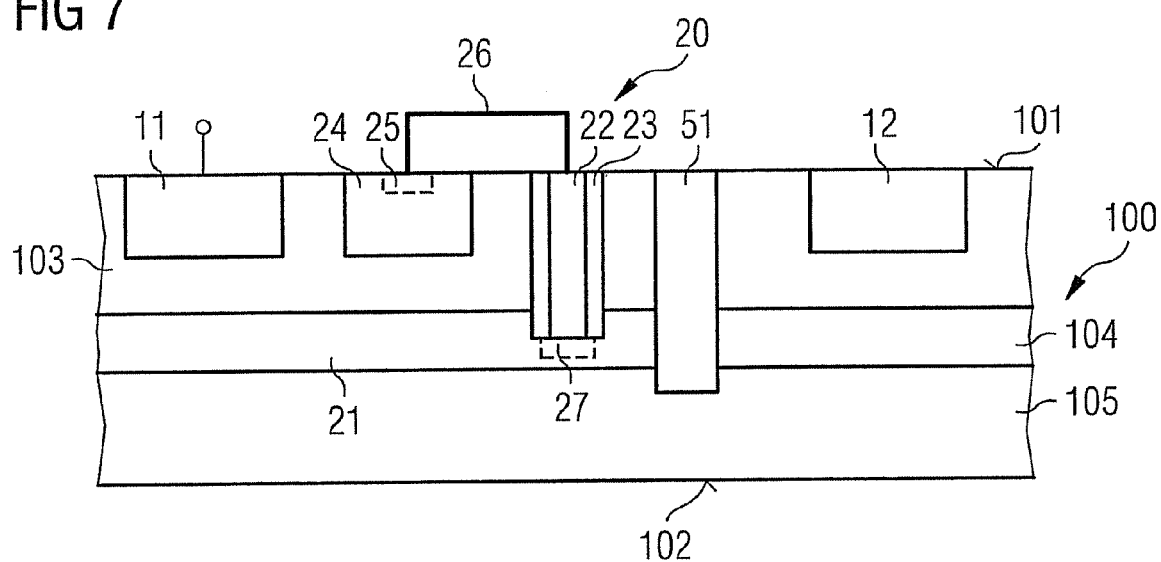
FIG. 7 illustrates an integrated circuit arrangement in which a semiconductor zone adjacent to the connecting zone is formed as a continuous semiconductor layer.

FIG. 7 illustrates an integrated circuit arrangement modified relative to the circuit arrangements explained above. In this circuit arrangement, the first semiconductor zone 21 of the protective structure 20 that extends as far as below the first component zone 11 is part of an originally continuous semiconductor layer 104 of the semiconductor body 100. In this case, the semiconductor body 100 includes a first semiconductor layer 103, in which the component zones 11, 12 and also the second component zone 24 of the protective structure 20 are arranged, a second semiconductor layer 104, which is arranged below the first semiconductor layer 103 proceeding from the front side 101 and which is of the first conduction type like the first semiconductor layer 103, but is doped more highly than the first semiconductor layer 103 and forms the first semiconductor zone 21 of the protective structure 20 in sections. In a direction of the rear side 102, there is adjacent to the second semiconductor layer 104 a further semiconductor layer 105, which may be of the first or second conduction type. The third semiconductor layer 105 is for example, a semiconductor substrate, and the first and second semiconductor layers 103, 104 are for example epitaxial layers applied to the semiconductor substrate 105. However, the second semiconductor layer 104 can also be a doped semiconductor region produced by implantation of dopant atoms.

In the circuit arrangement illustrated in FIG. 7, contact is made with the first semiconductor zone 21 by the connecting zone 22 in a manner that has already been explained in principle, in which case a highly doped connection zone 27 can be arranged between the connecting zone 22 and the first semiconductor zone 21. Upon injection of minority charge carriers from the first component zone 11 into the first semiconductor layer 103, there is a shift in the electrical potential of the second component zone 24 and thus in the electrical potential of the first component zone 21 of the protective structure 20. In this case, the effect of this potential shift is intended to remain limited to the region of the first component zone 11. In order to achieve this, the second semiconductor layer 104 is subdivided into individual segments by trenches which extend into the semiconductor body 100 proceeding from the front side 101 and are filled with an insulation material 51. The segment arranged below the first component zone 11 in this case forms the first component zone 21 of the protective structure 20. In this case, the trench for subdividing the second semiconductor layer 104 into individual segments is realized in such a way that it surrounds the first component zone 11 in ring-shaped fashion in a lateral direction, whereby that portion of the second semiconductor layer 104 which is arranged below the first component zone 11 is completely isolated from remaining portions of the semiconductor layer.

The circuit or component structure illustrated in FIG. 7 is simple to realize firstly by making available a semiconductor body 100 having the three semiconductor layers 102, 104, 105. The second semiconductor layer 104 can be subdivided into individual portions by etching trenches proceeding from the front side 101, the trenches extending in a vertical direction right into the third semiconductor layer 105 and subsequently being filled with an insulation material. The insulation material 51 for example is a semiconductor oxide, for example silicon oxide when using silicon as semiconductor material. The trench can be filled with the semiconductor oxide, for example by using a thermal oxidation or by filling the trench with a depositable oxide.

Figure 8:
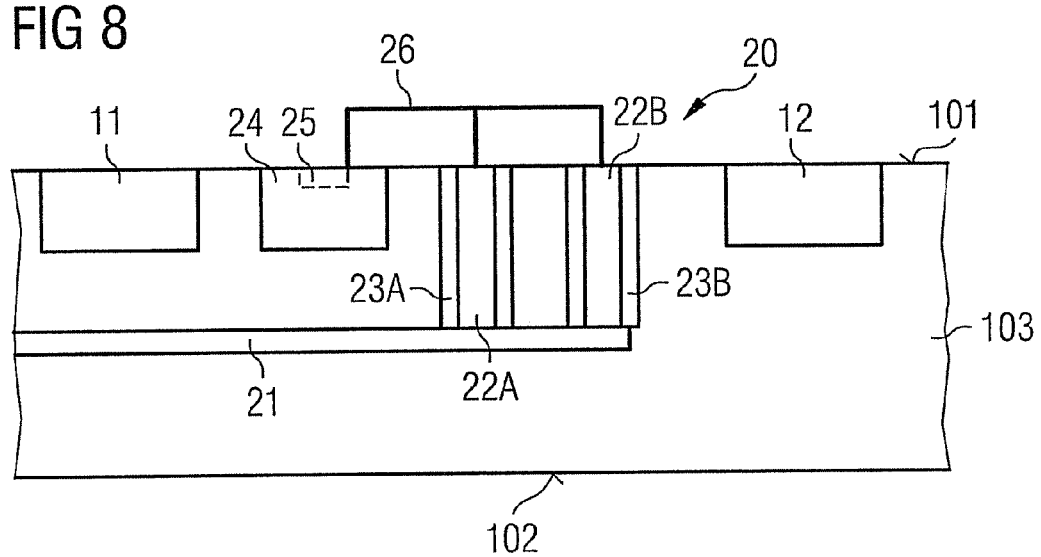
FIG. 8 illustrates an exemplary embodiment of an integrated circuit arrangement in which the protective structure has a plurality of first semiconductor zones between the first and second component zones.

The present invention is not restricted to a protective structure with only one buried first semiconductor zone of the first conduction type. Referring to FIG. 8, it is also possible to arrange a plurality—two in the example illustrated—of connecting zones 22A, 22B in a lateral direction between the first and second component zones 11, 12, which are connected to the second semiconductor zone 24 of the protective structure 20 via a line connection 26 and which are adjacent to the first semiconductor zone 21 in the semiconductor body. The connecting zones are in each case insulated by insulation layers 23A, 23B from those regions of the semiconductor substrate 103 which have the basic doping.

In the example embodiments explained above, the doping concentration of the semiconductor substrate/epitaxial layer 103 and the substrate 105 lies for example, between $2 \cdot 10^{14}$ cm$^{-3}$ and $9 \cdot 10^{15}$ cm$^{-3}$, that of the first semiconductor zone 21 of the protective structure lies, for example, between $2 \cdot 10^{14}$ cm$^{-3}$ and $10^{20}$ cm$^{-3}$, that of the optional connection zones 25 and 27 lies, for example, between $1 \cdot 10^{19}$ cm$^{-3}$ and $1 \cdot 10^{21}$ cm$^{-3}$ and that of the second semiconductor zone 24 lies for example between $1 \cdot 10^{16}$ cm$^{-3}$ and $1 \cdot 10^{20}$ cm$^{-3}$.

In the case of the protective structure explained, a reduction of the propagation of minority charge carriers is all the more pronounced, the more highly the first semiconductor zone 21 is doped in comparison with the semiconductor layer 103. In the limiting case, the doping concentration of the first semiconductor zone 21 can correspond here to the doping concentration of the first semiconductor layer 103.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit arrangement comprising:
at least one first semiconductor zone of a first conduction type which is doped more highly than the basic doping of a first semiconductor layer and which is arranged at a distance from a first component zone adjoining the first semiconductor layer;
at least one connecting zone which extends as far as the at least one first semiconductor zone proceeding from a first side; and
a second semiconductor zone of a second conduction type, which is arranged in the first semiconductor layer and which is electrically conductively connected to the at least one connecting zone, the second semiconductor zone configured to change its electrical potential by taking up minority charge carriers from the first semiconductor layer.

2. The integrated circuit arrangement of claim 1, wherein the second semiconductor zone is arranged, in a lateral direction, adjacent to a side of the connecting zone which faces the first component zone.

3. The integrated circuit arrangement of claim 1, wherein the connecting zone surrounds the first component zone in ring-shaped fashion in a lateral direction.

4. An integrated circuit arrangement comprising:
a semiconductor body having a first side and second side and a first semiconductor layer adjacent to the first side and having a basic doping of a first conduction type;
a first and a second component zone of a second conduction type, which is complementary to the first conduction type, the component zones being arranged at a distance from one another in the first semiconductor layer in a lateral direction of the semiconductor body;
comprising a protective structure having:
at least one first semiconductor zone of the first conduction type which is doped more highly than the basic doping of the first semiconductor layer and which is arranged, in a vertical direction, at a distance from the first side and from the first component zone in the first semiconductor layer and in a manner adjoining the first semiconductor layer, and which extends in a lateral direction as far as below the first component zone;
at least one connecting zone which extends as far as the at least one first semiconductor zone proceeding from the first side; and
a second semiconductor zone of the second conduction type, which is arranged in the first semiconductor layer and which is electrically conductively connected to the at least one connecting zone, the second semiconductor zone configured to change its electrical potential by taking up minority charge carriers from the first semiconductor layer.

5. The integrated circuit arrangement of claim 4, wherein the second semiconductor zone is arranged, in a lateral direction, adjacent to a side of the connecting zone which faces the first component zone.

6. The integrated circuit arrangement of claim 4, wherein the connecting zone surrounds the first component zone in ring-shaped fashion in a lateral direction.

7. The integrated circuit arrangement of claim 4, wherein the second semiconductor zone surrounds the first component zone in ring-shaped fashion in a lateral direction.

8. The integrated circuit arrangement of claim 4, comprising wherein the first component zone surrounds the second semiconductor zone in ring-shaped fashion in a lateral direction.

9. The integrated circuit arrangement of claim 4, comprising wherein the first component zone is arranged adjacent to an edge of the semiconductor body, in which the connecting zone is arranged at sides of the first component zone which do not face the edge, and in which the second semiconductor zone of the protective structure is arranged between the first component zone and the edge.

10. The integrated circuit arrangement of claim 4, wherein the at least one connecting zone is electrically insulated from the first semiconductor layer by an insulation layer at least in sections in the lateral direction.

11. The integrated circuit arrangement of claim 10, wherein the connecting zone is composed of a metal or of a doped polycrystalline semiconductor material.

12. The integrated circuit arrangement of claim 4, in which the connecting zone is a doped semiconductor zone of the first conduction type.

13. The integrated circuit arrangement of claim 4, in which the protective structure has a third semiconductor zone of the first conduction type, which is doped more heavily than the first semiconductor layer, which is arranged in the lateral direction between the first component zone and the second semiconductor zone of the protective structure and which is connected to a connection for a first bias voltage potential.

14. The integrated circuit arrangement of claim 4, comprising wherein the protective structure has a further semiconductor zone of the first conduction type, which is doped more heavily than the first semiconductor layer which is arranged in the lateral direction between the protective structure and the second semiconductor zone and which is connected to the second semiconductor zone and/or the connecting zone.

15. The integrated circuit arrangement of claim 4, comprising wherein a fourth semiconductor zone of the second conduction type is present, which is arranged in the lateral direction between the connecting zone and the second component zone and which is connected to a connection for a second bias voltage potential.

16. The integrated circuit arrangement of claim 4, wherein the first semiconductor layer extends in the vertical direction as far as the second side of the semiconductor body.

* * * * *